United States Patent
Kuehn

(10) Patent No.: US 9,479,165 B2
(45) Date of Patent: Oct. 25, 2016

(54) INDUCTIVE PROXIMITY SWITCH AND METHOD FOR ITS OPERATION

(75) Inventor: Thomas Kuehn, Mannheim (DE)

(73) Assignee: PEPPERL + FUCHS GmbH, Mannheim (DE)

( * ) Notice: Subject to any disclaimer, the term of this patent is extended or adjusted under 35 U.S.C. 154(b) by 653 days.

(21) Appl. No.: 12/280,048

(22) PCT Filed: Feb. 21, 2007

(86) PCT No.: PCT/DE2007/000327
§ 371 (c)(1),
(2), (4) Date: Jan. 13, 2009

(87) PCT Pub. No.: WO2007/095921
PCT Pub. Date: Aug. 30, 2007

(65) Prior Publication Data
US 2009/0243615 A1    Oct. 1, 2009

(30) Foreign Application Priority Data

Feb. 22, 2006  (DE) .................. 10 2006 008 211
Jan. 23, 2007  (DE) .................. 10 2007 003 374

(51) Int. Cl.
H03K 17/95         (2006.01)

(52) U.S. Cl.
CPC ........ H03K 17/9547 (2013.01); H03K 17/954 (2013.01)

(58) Field of Classification Search
CPC ........ G01V 3/081; G01V 3/10; G01V 3/101; G01V 3/102; G01V 3/104; G01V 3/105; G01V 3/107; G01V 3/108; G01V 3/15; G01V 3/16; G01V 3/165; G01V 8/10; H03K 2217/945; H03K 17/954; H03K 2217/956; H03K 17/94; H03K 17/95; H03K 17/952; H03K 17/9535; G05B 2219/37277

USPC ........ 307/116; 320/134; 324/207.16, 207.17, 324/207.19, 326, 544; 330/9; 331/116 R, 331/23, 65; 375/242, 249
See application file for complete search history.

(56) References Cited

U.S. PATENT DOCUMENTS 5,012,206 A * 4/1991 Tigges ............................ 331/65
5,264,733 A * 11/1993 Tigges ......................... 307/116
(Continued)

FOREIGN PATENT DOCUMENTS

DE       100 12 830 A1    9/2001
EP       0 479 078 A2     4/1992
(Continued)

OTHER PUBLICATIONS

PCT/DE2007/000327, International Search Report, pp. 1-3.

*Primary Examiner* — Son Le
(74) *Attorney, Agent, or Firm* — Hoffman Warnick LLC

(57) ABSTRACT

The invention relates to an inductive proximity switch having a current-fed resonant circuit comprising at least one resonant circuit transmitting coil and a capacitance. The resonant circuit transmitting coil generates an alternating magnetic field, which is able to induct a mutual induction voltage in at least one receiving coil, and the oscillation state of the resonant circuit can be influenced by a metallic release entering or moving away from the alternating field, having an evaluating circuit for obtaining a switching signal from the change in the oscillation state of the resonant circuit, the change in the complex coupling between the at least two coils, namely transmitting coil and receiving coil, being evaluatable with the aid of an auxiliary voltage signal as a switching signal in the presence or absence of the release.

21 Claims, 6 Drawing Sheets

(56) References Cited

U.S. PATENT DOCUMENTS

| | | |
|---|---|---|
| 5,508,662 A * | 4/1996 | Guichard et al. ............... 331/65 |
| 6,731,119 B2 * | 5/2004 | Haffner et al. ............... 324/635 |
| 7,106,052 B2 * | 9/2006 | Ehls et al. ............... 324/207.12 |
| 2002/0153946 A1 * | 10/2002 | Nguyen ............................ 330/9 |

FOREIGN PATENT DOCUMENTS

| | | |
|---|---|---|
| JP | 01-212005 | 8/1989 |
| JP | 2001203565 A | 7/2001 |
| WO | WO 2006/021045 A1 | 3/2006 |

* cited by examiner

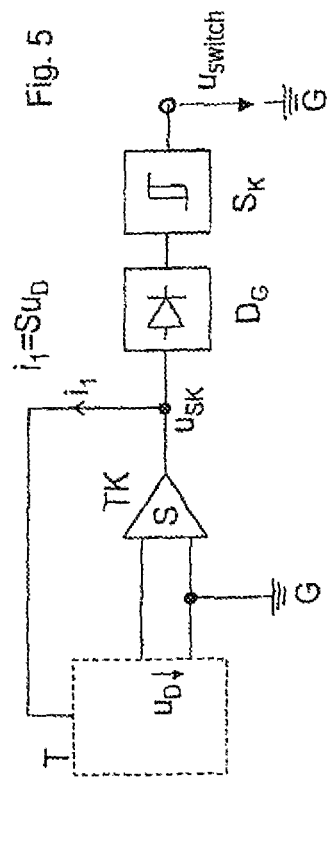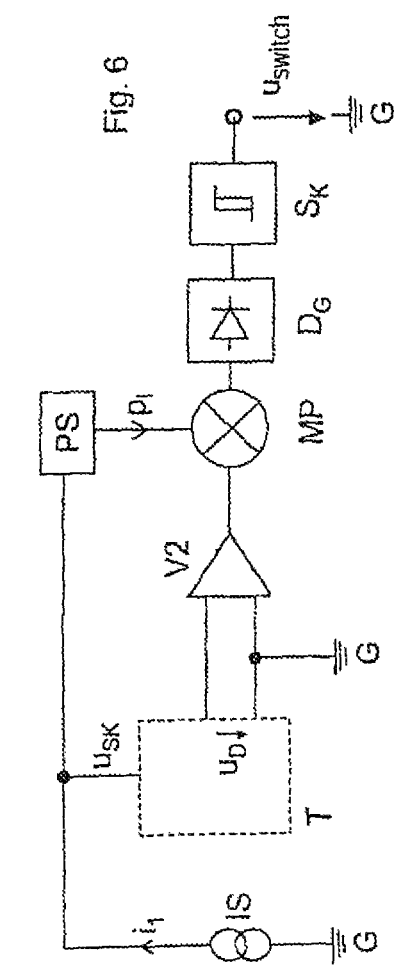

$$v = \frac{L_{S2} + k\sqrt{L_{S1}L_{S2}}}{L_{S1} + L_{S2} + 2k\sqrt{L_{S1}L_{S2}}}$$

(k = coupling  $L_{S1}$, $L_{S2}$)

$$v = v_u \frac{L_{S2} + k\sqrt{L_{S1}L_{S2}}}{L_{S1} + L_{S2} + 2k\sqrt{L_{S1}L_{S2}}}$$

$v_u$ optionally alignable

INDUCTIVE PROXIMITY SWITCH AND METHOD FOR ITS OPERATION

TECHNICAL FIELD

The invention relates to an inductive proximity switch having a current-fed resonant circuit comprising at least one resonant circuit transmitting coil and a capacitance, the resonant circuit transmitting coil generating an alternating magnetic field, which is able to induct a mutual induction voltage in at least one receiving coil, and the oscillation state of the resonant circuit can be influenced by a metallic release entering or moving away from the alternating field, having an evaluating circuit for obtaining a switching signal from the change in the oscillation state of the resonant circuit, the change in the complex coupling between the at least two coils, namely transmitting coil and receiving coil, being evaluatable with the aid of an auxiliary voltage signal as a switching signal in the presence or absence of the release. The invention also relates to a method for operating such an inductive proximity switch.

PRIOR ART

Inductive proximity switches are sensors, which react in contactless manner to the approach of a metallic or nonmetallic object or target, i.e. without direct contact. For detecting the approach of such a target by means of an inductive proximity switch, DE-AS 1 286 099 discloses an eddy current method, in which the eddy current losses brought about in an alternating magnetic field by the release are evaluated. For this purpose with a LC resonant circuit an oscillator generates an alternating magnetic field, which changes when eddy current losses occur. As a result there is a change in the oscillation amplitude, which is evaluated by an evaluating circuit on reaching a preset switching value and which is e.g. able to control a relay or some other on-load switch. A disadvantage of such proximity switches is the fact that differently conducting releases lead to differently high eddy current losses and therefore to different response intervals of the proximity switch.

In more recent inductive proximity switches a singe coil is replaced by a transformer having a primary coil and a secondary coil, which are inductively coupled. The magnitude of the coupling between primary and secondary circuit is called the coupling factor which can usually be set between 0 (no coupling) and 1 (perfect coupling), the coupling factor K determining the magnitude of the mutual inductance M of the circuit. A target brought into the switching range of the proximity switch changes the coupling. Coupling evaluation avoids numerous disadvantages associated with proximity switches having only one coil. However, in the prior art it has itself suffered from the disadvantage that it is not easy to implement due to the lower signal level.

In the case of inductive proximity switches with the evaluation of the change of the complex coupling or transimpedance between at least two coils (primary or transmitting coil and secondary or receiving coil, respectively), particularly circuit board coils, in the presence of a metallic target or a metallic release, gives rise to the further following main problems:

In particular with increased switching intervals there are extremely low relative changes of the transimpedance (max. a few 1000 ppm/K), which makes a direct secondary voltage evaluation much more difficult.

The temperature influence on the circuit layout, particularly as a result of the temperature dependence of the real part of the transmitting coil impedance (Cu-losses: Tk=+3800 ppm/K) is considerable.

When using circuit board coil arrangements and small constructions there are only low transmitting coil impedances and transimpedances, so that correspondingly high currents must flow in order to implement adequately high voltages.

Thus, it is already known from the prior art to implement a current impression in the primary coil and a direct evaluation of the secondary voltage or transimpedance changes, e.g. with a positive feedback amplifier (oscillator). As a result there is an independence from the real part of the transmitting coil impedance. However, this leads to the further problem that small relative changes of the transimpedance require an extreme stability of the amplifier (dv/v max a few 100 ppm/K) and a highly linear power supply. In the case of LP coils, due to the low impedances only low voltage amplitudes are possible, because the possible current amplitude is in practice highly limited.

It is also known to implement a current infeed into a (parallel) resonant circuit formed from the primary coil and a capacitance. This leads to the advantage that the power supply operates against the much higher resonant impedance of the circuit, so that higher amplitudes can be obtained. A disadvantage of this solution is that the resonant impedance or primary voltage, respectively, is highly temperature-dependent (Tk=−3800 ppm/K). As in a good approximation the secondary and primary voltages are proportional, the secondary voltage also has this temperature dependence. Thus, the temperature influences will well cover the useful signal, i.e. the target-induced secondary voltage change.

To boost the relative output signal change it is known from EP 0 479 078 A and U.S. Pat. No. 6,657,323 to subtract a "reference voltage" from the secondary voltage and which is formed by a second secondary coil, which is spatially separated and remains virtually uninfluenced by the release. To this end EP 479 078 A is based on an inductive proximity switch with an oscillator, which feeds a transmitting coil, which generates an alternating magnetic field, the oscillator being influenced in its oscillation state by a metallic release entering the alternating field and with an evaluating circuit for obtaining a switching signal from the oscillation state change. In the alternating field there are two sensor coils in direct differential connection for determining the difference of the voltages induced in both sensor coils, which are so constructed as a result of their spatial position to each other and the number of turns in each case that the alternating differential voltage becomes zero at the desired response interval. The alternating differential voltage is fed back to the input of the oscillator amplifier in such a way that with a zero alternating differential voltage the oscillator suddenly changes its oscillation state. The transmitting coil is connected as an inductance of the LC resonant circuit of the oscillator, the oscillator amplifier input being high-impedance and the two sensor coils with opposite polarisation are connected in series between a voltage divider and the high-impedance input of the oscillator amplifier. This leads to a significantly lower differential voltage which now has a much greater relative change. However, the subtraction by the antiserial interconnection of the two coils leads to the disadvantage that the differential voltage is once again subject to a significant temperature dependence, e.g. Tk=−3800 ppm/K. An intrinsic compensation of the temperature dependence can consequently not be expected. The temperature influence is still reduced in accordance with the increase of the relative change.

DE 19611810A1 discloses a contactless operating proximity switch with a resonant circuit influenceable by metallic objects brought up from the outside and with an evaluating device for obtaining a switching signal from an output signal describing the change of the oscillation state of the resonant circuit. The resonant circuit is a resonant circuit bridge with at least two capacitors and with at least two coils differently influenceable by the objects brought up from the outside, the bridge diagonal voltage being evaluated.

DE 19843749A1 discloses a method for evaluating small changes of a capacitance using an electrical bridge circuit, in whose bridge arms are in each case provided a capacitor in the form of reactances and the bridge is supplied with an alternating voltage as the bridge supply voltage and at least one of the capacitors is variable. The two bridge arm voltages are separately rectified according to the given bridge half, the bridge diagonal voltage only being evaluated following the rectification of the two bridge arm voltages as a direct voltage changing in accordance with the capacitance change.

Technical Problem

The problem of the invention is to provide an inductive proximity switch, which over a wide temperature range of at least −25° C. to +100° C. has a constant interval with respect to its response behaviour and which can be used as an all-metal switch responding to ferrous and nonferrous metal releases for the same response interval; likewise, it must be possible to use the proximity switch as a selective switch, which responds only to either ferrous or nonferrous metals.

Disclosure of the Invention and its Advantages (A1) This problem is solved in the case of an inductive proximity switch of the aforementioned type in that the auxiliary voltage signal is obtained as a partial voltage from the resonant circuit voltage of the resonant circuit in a presettable ratio, the auxiliary voltage signal being connected in series with the mutual induction voltage induced in the receiving coil in such a way that to earth or to a potential a differential voltage is obtained at the output of the receiving coil whose amount is reduced by the auxiliary voltage signal compared with the induced mutual induction voltage, the differential voltage being supplied to the evaluating circuit for obtaining the switching signal.

Thus, on making available an impressed current in the resonant circuit the differential voltage can generally be directly obtained and further processed in an appropriate manner.

(A2) In a further, preferred inventive development of the inductive proximity switch, the latter has a current-fed oscillator comprising at least one resonant circuit transmitting coil and a capacitance, the resonant circuit transmitting coil generating an alternating magnetic field, which is able to induce a mutual induction voltage in at least one receiving coil, and the oscillation state of the oscillator can be influenced by a metallic release entering or moving away from the alternating field, with an evaluating circuit for obtaining a switching signal from the change of the oscillation state of the oscillator, the change in the complex coupling between the at least two coils, namely transmitting coil and receiving coil, being evaluatable with the aid of an auxiliary voltage signal in the form of a switching signal in the presence or absence of the release, the differential voltage, unlike in claim 1, being supplied to a transconductance amplifier for obtaining and feeding back the current proportional to the differential voltage and supplying the oscillator resonant circuit and the resonant circuit voltage is supplied to the evaluating circuit for obtaining the switching signal.

Thus, the inventive inductive proximity switch has the advantage of a virtually perfect temperature independent and at the same time a high relative differential voltage change on approaching a target.

(A3) This can advantageously be obtained in the case of the inventive, inductive proximity switch, no matter whether it is only with a resonant circuit or with an oscillator, in that by means of a presettable ratio between the auxiliary voltage signal and the resonant circuit voltage the differential voltage can be so selected that the said differential voltage becomes temperature-independent either in the case of resonance of the resonant circuit or in the resonance amplitude of the resonant circuit voltage, respectively, or is temperature-independent for a resonant circuit voltage amplitude which is located symmetrically to the resonant frequency of the resonant circuit on the resonance slopes.

(A15) In a further advantageous development of such an inventive proximity switch, by means of a power source a supply current is impressed on the resonant circuit and the differential voltage is supplied to an amplifier, to whose output is connected one input of a multiplier, and to whose other input is applied the phase information of the current supplying the resonant circuit, preferably being influenced by means of a phase shifter, the multiplier output being supplied to the evaluating circuit for obtaining the switching signal.

Said temperature independence is obtained both in the case of a resonant circuit with an impressed supply current and in particular with an oscillator with a fed-back supply current.

(A4) In a further advantageous development of the inventive proximity switch, in which the resonant circuit is connected to an oscillator, the transconductance amplifier has a selectable slope.

(A5) In an advantageous development of the inventive inductive proximity switch for obtaining the auxiliary voltage signal as a partial voltage in a presettable ratio from the resonant circuit voltage of the resonant circuit, the resonant circuit voltage is applied to the inputs of an amplifier with presettable gain, whose output signal, either to earth or to a potential, forms the auxiliary voltage signal, one end of the receiving coil being applied to the amplifier output and, to earth or to a potential, the differential voltage is obtained at its other end.

(A6) In a further advantageous development of the proximity switch for obtaining the auxiliary voltage signal as a partial voltage in a presettable ratio from the resonant circuit voltage of the resonant circuit, a complex voltage divider from a series connection of two complex resistors is connected in parallel thereto, the auxiliary voltage signal falling across the second complex resistor and one end of the receiving coil is applied to the centre point of the voltage divider and the differential voltage is obtained at its other end.

Thus, the complex voltage divider with at least the complex resistors $Z_1$ and $Z_2$ divides the circuit or primary voltage in an adjustable ratio v, so that through the corresponding choice of the divider ratio $$v = Z_2/(Z_1 + Z_2)$$

a differential voltage $u_D$ to earth or ground is obtained, which has both a virtually perfect temperature independence and also a high relative change on approaching the target. As a result a self-compensated system can be obtained. Moreover, in highly advantageous manner, no second, remote secondary coil is needed.

(A7) In a further advantageous development of the proximity switch the series connection of the two complex resistors of the voltage divider is a series connection of two capacitors, the auxiliary voltage signal falling across the second of the two capacitors.

(A8) It is possible for the capacitance of the resonant circuit to be wholly or partially formed by the capacitors or one of the capacitors or the self-capacitance of the transmitting coil.

The use of the aforementioned network designs with an amplifier or a preferably complex voltage divider are also independent of whether use is made of a resonant circuit with an impressed supply current or an oscillator with a fed-back supply current.

(A9) In a further development of the inventive proximity switch for obtaining the auxiliary voltage signal as a partial voltage in a presettable ratio from the resonant circuit voltage of the resonant circuit, with the latter is connected in parallel a complex voltage divider of a series connection of two complex resistors, the auxiliary voltage signal falling across the second complex resistor and is simultaneously applied to two signal inputs of an impedance converter and one end of the receiving coil is applied to the output of the impedance converter and the differential voltage is obtained at the output of the receiving coil, to earth or to a potential. Thus, the centre tap of the voltage divider is applied to one input of the impedance converter, to whose other input is applied the joint base of the resonant circuit and voltage divider, i.e. in the simplest case to earth or ground, the auxiliary voltage being supplied by the impedance converter output signal.

(A10) In a further development of the proximity switch at least one of the two complex resistors of the complex voltage divider is adjustable, so that the resonant circuit voltage of the resonant circuit is divided in an adjustable ratio and consequently an adjustable differential voltage is obtained at the receiving coil output.

(A11) Moreover, the voltage divider of the inventive proximity switch can be implemented with ohmic resistors.

(A12) In a further development of the proximity switch the transmitting coil and receiving coil form a planar coil system. (A13) In the same way the transmitting coil and receiving coil can be implemented as circuit board coils.

(A14) In a further development of the proximity switch the resonant circuit voltage is rectified and supplied to a threshold discriminator for obtaining the switching signal.

(A16) Furthermore, the auxiliary or differential voltage $u_{Hsp}$ through a correspondingly positioned tap can be obtained by a tapping point at the transmitting coil $L_S$, said tapping point subdividing the transmitting coil $L_S$ into the partial inductances $L_{S1}$ and $L_{S2}$.

(A17) The voltage obtained from the coil tap of transmitting coil $L_S$ can be amplified in an amplifier A or impedance converter, respectively, so that the auxiliary or differential voltage $u_{Hsp}$, respectively, is available downstream of the amplifier.

(A18) From the method standpoint the set problem for the operation of an inductive proximity switch of the aforementioned type is solved in that the auxiliary voltage signal is obtained as a partial voltage from the resonant circuit voltage of the resonant circuit in a presettable ratio, the auxiliary voltage signal being so connected in series with the mutual induction voltage induced in the receiving coil that at the output of said receiving coil, to earth or to a potential, a differential voltage is obtained, whose quantity is reduced by the auxiliary voltage signal compared with the induced mutual induction voltage, the differential voltage being supplied to the evaluating circuit for obtaining the switching signal.

(A19) In a further advantageous development of the inventive method and when using an oscillator with feedback current infeed, the differential voltage is supplied to a trans-conductance amplifier, whose current proportional to the differential voltage is fed back into the oscillator resonant circuit, the resonant circuit voltage being supplied to the evaluating circuit for obtaining the switching signal.

(A20) From the method standpoint it is possible in this way to divide the resonant circuit voltage of the resonant circuit in an adjustable ratio and consequently obtain at the receiving coil output an adjustable differential voltage.

(A21) In a further inventive development of the method, by means of the presettable ratio between auxiliary voltage signal and resonant circuit voltage, the differential voltage is so selected that it becomes temperature-independent either at resonance of the resonant circuit or in the resonance amplitude of the resonant circuit voltage, respectively, or becomes temperature-independent for an amplitude of the resonant circuit voltage, which is located symmetrically to the resonant frequency of the resonant circuit on the resonance slopes.

(A22) Generally the invention is consequently characterized by a network for the operation of an inductive proximity switch, the network having a current-fed resonant circuit comprising at least one resonant circuit transmitting coil and a capacitance, and the resonant circuit transmitting coil generates an alternating magnetic field, which is able to induce a mutual induction voltage in at least one receiving coil, and the oscillation state of the resonant circuit can be influenced by a metallic release entering or moving away from the alternating field, and from the change of the oscillation state of the resonant circuit it is possible to obtain a switching signal, the change to the complex coupling between the at least two coils, namely transmitting coil and receiving coil, being evaluatable as a switching signal with the aid of an auxiliary voltage signal in the presence or absence of the release. The auxiliary voltage signal is obtained as a partial voltage from the resonant circuit voltage of the resonant circuit of the network in a presettable ratio, the auxiliary voltage signal being connected in series with the mutual induction voltage induced in the receiving coil in such a way that, to earth or to a potential, a differential voltage is obtained at the receiving coil output, the amount of which is reduced by the auxiliary voltage signal compared with the induced mutual induction voltage, the switching signal being generated from the differential voltage.

BRIEF DESCRIPTION OF THE DRAWINGS

FIG. 5 A circuit of an oscillator by means of a transconductance amplifier, in which the auxiliary voltage signal $u_{Hsp}$ is generated in accordance with the electrical network T of FIG. 2.

FIG. 6 A circuit of an oscillator by means of a transconductance amplifier, in which the auxiliary voltage signal $u_{Hsp}$ is generated according to the electrical network T of FIG. 1.

PREFERRED EMBODIMENTS OF THE INVENTION

Figure 1:
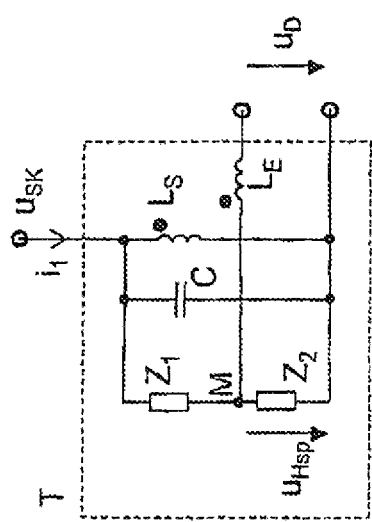
FIG. 1 An electrical circuit T of a general embodiment of the invention with a complex voltage divider resulting from a series connection of two complex resistors ($Z_1$, $Z_2$) for obtaining the auxiliary voltage signal $u_{Hsp}$.

Within the dotted line guide of FIG. 1 is shown a network T having a resonant circuit, which is preferably the resonant circuit of an oscillator of an inductive proximity switch, said resonant circuit comprising a transmitting coil $L_S$ and a capacitance C. The transmitting coil $L_S$ generates an alternating magnetic field, which induces in known manner a mutual induction voltage in a receiving coil $L_E$, which is inter alia dependent on the ratio of the number of turns of the two coils and the geometrical arrangement (coupling). The alternating magnetic field of the transmitting coil $L_S$ of the resonant circuit $L_S$, C is changed on moving towards or away from a metallic release, so that there is a change of the mutual induction voltage in receiving coil $L_E$. This leads to a change in the output voltage of the receiving coil $L_E$, known as the differential voltage $u_D$ and this will be explained in greater detail hereinafter.

To obtain an auxiliary voltage signal $u_{Hsp}$ as a partial voltage from the resonant circuit voltage $u_{SK}$ of the resonant circuit $L_S$, C application takes place parallel to the latter of a complex voltage divider comprising the two complex resistors $Z_1$ and $Z_2$, the voltage falling across the second-mentioned complex resistor $Z_2$ of the voltage divider being the auxiliary voltage $u_{Hsp}$ or the auxiliary voltage signal $u_{Hsp}$. One end of the receiving coil $L_E$ is supplied to the centre point M between the two complex resistors $Z_1$ and $Z_2$, so that the auxiliary voltage signal $u_{Hsp}$ is subtracted from or added to, respectively, the mutual induction voltage induced in receiving coil $L_E$ and thus the aforementioned, induced differential voltage $u_D$ is obtained at the output of receiving coil $L_E$, either to earth or ground G or to a potential and the amount thereof is reduced by the auxiliary voltage signal $u_{Hsp}$ compared with the mutual induction voltage induced in receiving coil $L_E$. As will be described in greater detail relative to FIGS. 5 and 6, the differential voltage $u_D$ is appropriately further processed. The supply voltage of the resonant circuit $L_S$, C is designated by the reference $i_1$ and is either part of an oscillator according to FIGS. 5 and 6, in which is fed back the supply current $i_1$, or the designation indicates the impressed supply current $i_1$ in resonant circuit $L_S$, C without it being connected as an oscillator.

Preferably the impedance of the voltage tap of differential voltage $u_D$ is higher than $Z_2$. From the circuit is obtained a divider ratio v for the complex voltage divider of:

$$v = Z_2/(Z_1+Z_2).$$

Figure 4:
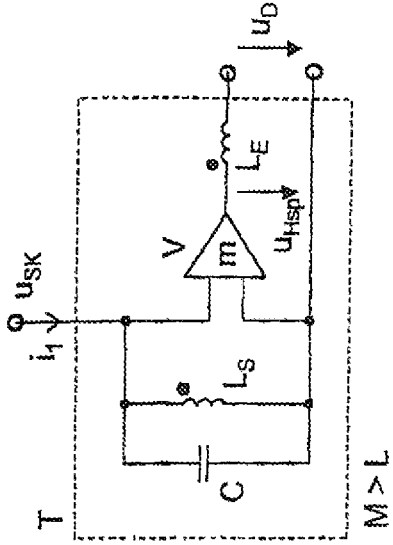
FIG. 4 A further inventive circuit T with an amplifier for generating the auxiliary voltage signal $u_{Hsp}$.

A more general circuit for implementing the invention is explained relative to network T of FIG. 4. The auxiliary voltage signal $u_{Hsp}$ is obtained as a partial voltage from the resonant circuit voltage $u_{SK}$ of resonant circuit $L_S$, C and for this purpose the resonant circuit voltage $u_{SK}$ is applied to the signal inputs of an amplifier V with the gain m, whose output signal, either to ground G or to a potential, forms the auxiliary voltage signal $u_{Hsp}$, either to ground G or to a potential. One end of receiving coil $L_E$ is applied to the output of amplifier V, so that the auxiliary voltage signal $u_{Hsp}$ is subtracted from or added to the mutual induction voltage induced in receiving coil $L_E$ by transmitting coil $L_S$ and, to ground G or to a potential, the differential voltage $u_D$ is obtained at the output of receiving coil $L_E$. As described in FIGS. 5 and 6, the differential voltage $u_D$ is appropriately further processed.

Figure 2:
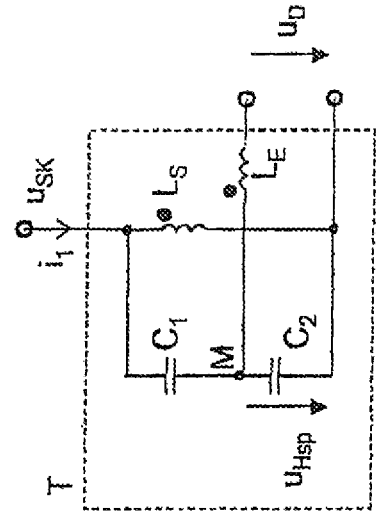
FIG. 2 A further circuit T, in which the complex voltage divider is formed from a series connection of two capacitors.

Within the network T, FIG. 2 shows a further circuit, in which the complex voltage divider comprises a series connection of two capacitors $C_1$ and $C_2$, but otherwise the circuit of FIG. 2 corresponds to that of FIG. 1. This gives for the divider ratio v of the voltage divider:

$$v = C_1/(C_1+C_2).$$

The auxiliary voltage $u_{Hsp}$ or auxiliary voltage signal $u_{Hsp}$ falls across the capacitor $C_2$, which in FIG. 2 is the second capacitor of the voltage divider. As described hereinbefore one end of the receiving coil $L_E$ is applied to the centre point M between the two capacitors $C_1$ and $C_2$, so that the auxiliary voltage signal $u_{Hsp}$ is subtracted from or added to the mutual induction voltage induced in the receiving coil $L_E$. Thus, either to ground G or to a potential, an induced differential voltage $u_D$ is obtained at the output of receiving coil $L_E$, the amount of which is reduced by the auxiliary voltage signal $u_{Hsp}$. As described in FIGS. 5 and 6, the differential voltage $u_D$ is again appropriately further processed.

The differential signal $u_D$ is obtained at the output of receiving coil $L_E$. The special point here is that the capacitance of the resonant circuit can be included in the capacitance $C_1$ or the capacitances $C_1+C_2$, so that the resonant circuit can be formed from transmitting coil $L_S$ and one of or the series connection of the capacitances $C_1$, $C_2$.

Figure 3:
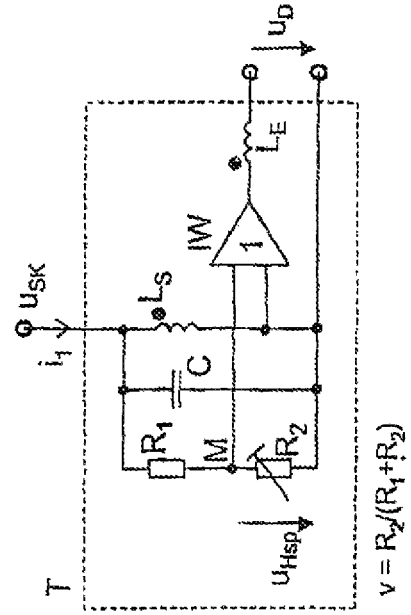
FIG. 3 A further inventive circuit T with an impedance converter for generating the auxiliary voltage signal $u_{Hsp}$.

For the generation of the auxiliary voltage signal $u_{Hsp}$, network T of FIG. 3 shows a further inventive circuit with an impedance converter IW. Here the voltage divider comprises two, preferably ohmic resistors $R_1$ and $R_2$, the second-mentioned resistor $R_2$ being variable. The auxiliary voltage $u_{Hsp}$ is applied across the signal inputs of impedance converter IW to the second resistor $R_2$ and falls across the same. To the output of impedance converter IW which has a lower impedance than its input is applied one end of receiving coil $L_E$, the differential signal $u_D$ being tapped at the other end of receiving coil $L_E$, reduced by the auxiliary voltage signal $u_{Hsp}$, either to ground or to a potential. As described in FIGS. 5 and 6, the differential voltage $u_D$ is appropriately further processed.

The divider ratio v is here formed by:

$$v = R_2/(R_1+R_2).$$

The above-described networks T of FIGS. 1 to 4 can advantageously be used in resonant circuits with impressed supply current $i_1$, if the differential voltage signal $u_D$ present at the receiving coil $L_E$ is appropriately further processed.

FIGS. 5 and 6 show preferred embodiments of an inventive inductive proximity switch, including an evaluating circuit for obtaining a switching signal $u_{switch}$, where one of the networks T according to FIGS. 1 to 4 is an essential part of the circuit.

In FIG. 5 one of the networks T is interconnected with a transconductance amplifier TK with slope S. The differential signal $u_D$ is applied to one input of transconductance amplifier TK, whose further input is either applied to ground G or a preset potential. A supply current $i_1$, $i_1 = S u_D$ is available at the transconductance amplifier output, which output is coupled back to the resonant circuit of network T, e.g. comprising $L_S$, C, $C_1$, $C_2$, $Z_1$, $Z_2$, $R_1$, $R_2$ for forming an oscillator and consequently represents a positive feedback amplifier operating in oscillatory manner. Thus, at the output of transconductance amplifier TK is provided the resonant circuit voltage $U_{SK}$ varying in accordance with $u_D$ and which is applied across the feedback path to a diode rectifier $D_G$, whose output signal is supplied to a threshold discriminator $S_K$ with a preset reference voltage and at the output thereof the switching signal $u_{switch}$ is obtained on reaching the reference voltage. An AD-converter can be used in place of a diode rectifier.

In FIG. 6 one of the networks T is interconnected with an amplifier V2, with the difference that here the resonant circuit of network T, e.g. comprising $L_S$, C, $C_1$, $C_2$, $Z_1$, $Z_2$, $R_1$, $R_2$, is not part of an oscillator. Instead a power source IS impresses a current $i_1$ in the resonant circuit of network T, which in the afore described manner emits the differential voltage signal $u_D$ at the output. Said signal is then applied to the input of an amplifier V2, whose further input is either applied to ground G or a preset potential. The output of amplifier V2 is led to a multiplier functioning as a synchronous rectifier. The phase information $p_i$ of the supply current $i_1$ is simultaneously supplied to the multiplier across a phase shifter PS. Once again the output signal of multiplier MP is applied to the diode rectifier $D_G$, whose output signal, as afore described, is supplied to the threshold discriminator $S_K$ for obtaining the switching signal $u_{switch}$.

Figure 7:
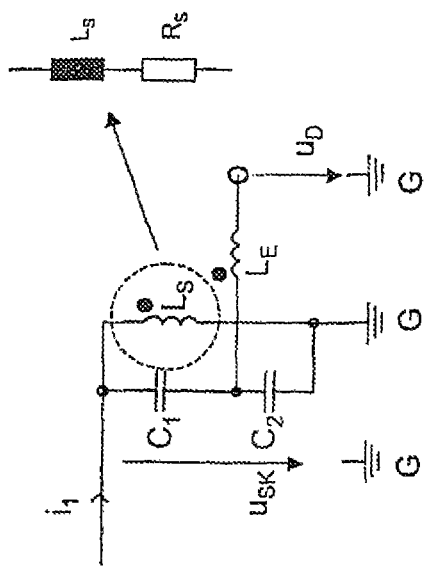
FIG. 7 An example with numerical values of the circuit components for the temperature compensation of the differential voltage $u_D$ according to network T of FIG. 2.

FIG. 7 shows a network with the associated numerical values of the circuit components for the temperature compensation of the differential voltage $u_D$, which corresponds to the network according to FIG. 2:

$L_S$=3.32 μH, $L_E$=1.34 μH,
k=0.2588->M=546 nH
$R_S$=2.7 Ohm (@ 25° C.), a=3800 ppm/K (Cu)
$C_1$=1.5 nF, $C_2$=variable; $i_1$=1 mA.

When e.g. using the aforementioned values of the circuit components in an inductive proximity switch in accordance with the circuit of FIG. 5, the latter has an almost perfect temperature independence.

Figure 8:
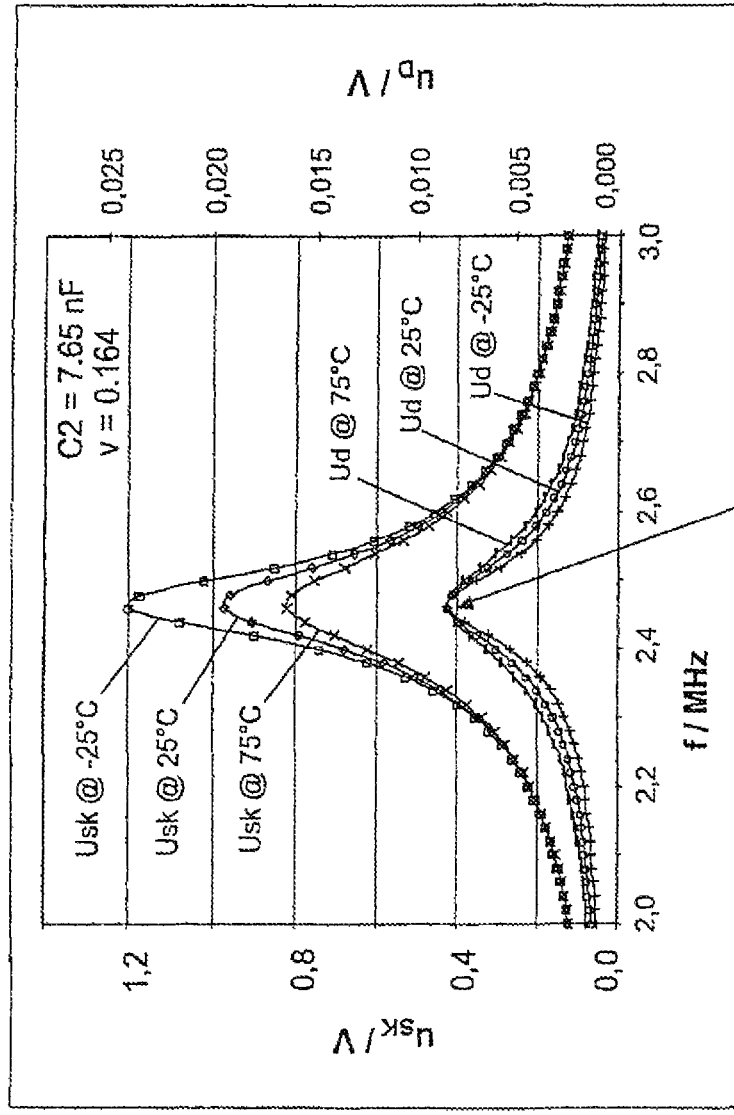
FIG. 8 A group of curves relating to the temperature compensation of the differential voltage $u_D$ in the case of amplitude resonance.
Figure 9:
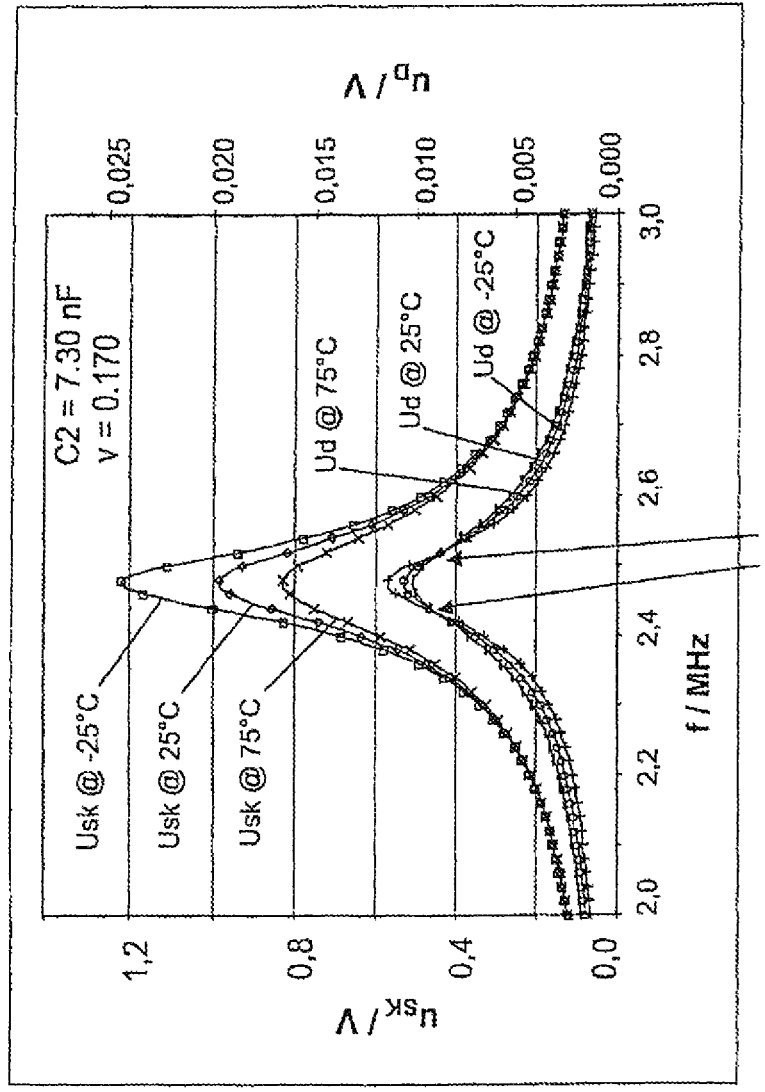
FIG. 9 A group of curves relating to the temperature compensation of the differential voltage $u_D$ on the slopes.

Examples 1 and 2 in FIGS. 8 and 9, respectively, show the temperature compensation of the inventive networks T at amplitude resonance or in the case of a temperature compensation on the slopes in accordance with the wiring with the components according to FIG. 7.

The respective capacitor $C_2$, across which the auxiliary voltage signal $u_{Hsp}$ falls, has a size $C_2$=7.65 nF or 7.30 nF, respectively, which gives v=$C_1/(C_1+C_2)$=0.164 and 0.170 respectively. On the ordinate is plotted the resonant circuit voltage $u_{SK}$/V and on the abscissa the resonant frequency f/MHz. It is clear that on operating the resonant circuit at different temperatures (−25° C., 25° C., 75° C.), at which naturally different resonance amplitudes are obtained, the associated differential voltage signals $u_D$ have a substantially identical amplitude maximum.

The same applies according to FIG. 9, example 2, in the case of temperature compensation on the slopes. The differential voltage signals $u_D$ belonging to the temperature-differing resonant circuit voltages in each case intersect in two points, namely roughly at Y=4.65*10$^{-1}$ $u_{SK}$/V, X=2.435 f/MHz or at Y=4.32*10$^{-1}$ $u_{SK}$/V, X=2.517 f/MHz, respectively.

Figure 10:
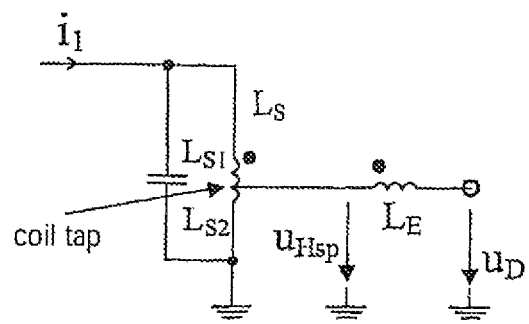
FIG. 10 A further development of the inventive circuit where the resonant circuit coil can be used as an inductive divider for obtaining the auxiliary or differential voltage.
Figure 11:
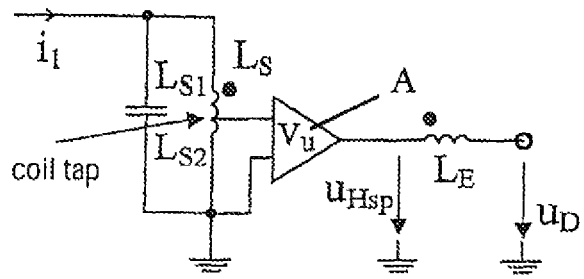
FIG. 11 A development of the inventive circuit based on FIG. 10, but where here the voltage obtained from the coil tap is amplified by the voltage obtained at point M in FIG. 3.

FIGS. 10 and 11 show two further preferred embodiments of an inventive inductive proximity switch for obtaining the auxiliary or differential voltage $u_{Hsp}$ or $u_D$, respectively. In both the embodiments of FIGS. 10 and 11 the auxiliary or differential voltage $u_{Hsp}$ or $u_D$ is not obtained by means of a capacitive voltage divider, but instead the auxiliary voltage generation $u_{Hsp}$ is brought about by a correspondingly positioned tap through a tapping point at transmitting coil $L_S$, said tapping point subdividing the transmitting coil $L_S$ into partial inductances $L_{S1}$ and $L_{S2}$. The tapping point at transmitting coil $L_S$ can be freely selected within wide ranges. A particular advantage of this variant is that when using print coils a particularly high reproducibility of the divider ratio v can be implemented therewith and is calculated as:

$$v = \frac{L_{S2} + k\sqrt{L_{S1}L_{S2}}}{L_{S1} + L_{S2} + 2k\sqrt{L_{S1}L_{S2}}} \quad (k = \text{coupling } L_{S1}, L_{S2})$$

FIG. 11 shows a development of the inventive circuit based on FIG. 10, where here the voltage obtained from the coil tap, corresponding to the voltage obtained at point M in FIG. 3, is amplified in an amplifier A or impedance converter, respectively. This permits an adjustability of the divider ratio v of partial inductances $L_{S1}$ and $L_{S2}$ of transmitting coil $L_S$ in that downstream of the transmitting coil $L_s$ are optionally additionally connected amplifier A or the impedance converter, which has an alignable voltage amplification. This leads to an effective divider ratio $v_{eff}$. The divider ratio v is calculated as given hereinafter, vu being optionally alignable:

$$v = v_u \frac{L_{S2} + k\sqrt{L_{S1}L_{S2}}}{L_{S1} + L_{S2} + 2k\sqrt{L_{S1}L_{S2}}}$$

In the embodiments of FIG. 1, 2, 3 or 7 with a complex or capacitive voltage divider for obtaining the auxiliary voltage signal $u_{Hsp}$ as a partial voltage from the resonant circuit voltage $u_{SK}$ of resonant circuit $L_S$, C, likewise in each case an amplifier, like amplifier A in FIG. 11, can be placed between the centre point M located between the two series-connected complex resistors $Z_1$ and $Z_2$ or the two series-connected capacitors $C_1$ and $C_2$, respectively, and the receiving coil $L_E$. Thus, the use of such an amplifier permits an alignable voltage amplification. The fixed ratio between input and output voltage, given there as "1", given in FIG. 3 in the image of impedance converter IW, need not be fixed but can as shown, be replaced or supplemented by a variable or adjustable voltage amplification between the input and output voltage as a result of the in broad ranges free selection of the tapping point at transmitting coil $L_S$ or in wide ranges free selection of the centre point M (FIGS. 1, 2, 3 and 7) within the network T, respectively.

COMMERCIAL USABILITY

The invention can in particular be commercially used in inductive proximity switches in order to significantly improve the temperature independence and relative change during the approach of a target or a release with a more or less good conducting characteristic.

REFERENCE NUMERALS LIST $L_S$ Transmitting coil
$L_E$ Receiving coil
C Resonant circuit capacitance
$Z_1, Z_2$ Complex resistors of a voltage divider
$C_1, C_2$ Capacitors of a capacitive voltage divider
$R_1, R_2$ Ohmic resistors of a voltage divider
$u_{Hsp}$ Auxiliary voltage or auxiliary voltage signal
$u_D$ Differential voltage or differential voltage signal
G Earth or ground
IW Impedance converter
V Amplifier
m Amplifier gain
S Transconductance amplifier
$D_G$ Diode rectifier
$S_K$ Threshold discriminator
$u_{switch}$ Voltage switching signal of evaluating circuit
$u_{SK}$ Resonant circuit voltage
$L_S$, C Resonant circuit
T Networks
$i_s$ Supply current for the resonant circuit
PS Phase shifter
$p_i$ Phase information from supply current is
MP Multiplier
IS Power source

The invention claimed is:

1. Network for the operation of an inductive proximity switch,
   the network having a current-fed resonant circuit comprising a resonant circuit transmitting coil and a capacitance, and
   the resonant circuit transmitting coil generating an alternating magnetic field for inducing a mutual induction voltage in at least one receiving coil,
   and
   an oscillation state of the resonant circuit is influenced by a metallic release entering or moving away from the alternating magnetic field, and from a change of the oscillation state of the resonant circuit is obtained a switching signal,
   a change of a complex coupling between the at least two coils, namely transmitting coil and receiving coil, being evaluatable as a switching signal with aid of an alternating auxiliary voltage in a presence or absence of the release,
   wherein the alternating auxiliary voltage signal is obtained as a partial voltage from an alternating resonant circuit voltage of the resonant circuit of the network in a presettable ratio,
   a complex voltage divider resulting from a series connection of two complex resistors is connected in parallel to at least one of the transmitting coil and capacitance of the resonant circuit, wherein the alternating auxiliary voltage signal falls across one of the complex resistors,
   the alternating auxiliary voltage signal being connected in series with the mutual induction voltage induced in the receiving coil such that a differential voltage to ground or to a potential is obtained at an output of the receiving coil, wherein a value of the differential voltage is reduced by the alternating auxiliary voltage signal compared with the induced mutual induction voltage, the switching signal being generated from the differential voltage,
   an evaluating circuit for obtaining a switching signal from the change of the oscillation state of the resonant circuit,
   wherein
   the auxiliary or differential voltage, respectively, is obtained by a correspondingly positioned tap through a tapping point on the transmitting coil, the tapping point subdividing the transmitting coil into the partial inductances.

2. Inductive proximity switch according to claim 1, wherein
   the differential voltage is supplied to the evaluating circuit for obtaining the switching signal.

3. Inductive proximity switch according to claim 1, wherein
   the differential voltage is supplied to a transconductance amplifier for obtaining and returning a current proportional to the differential voltage and feeding the resonant circuit of the oscillator, and a resonant circuit voltage is supplied to the evaluating circuit for obtaining the switching signal.

4. Inductive proximity switch according to claim 2, wherein
   by means of the presettable ratio between the auxiliary voltage signal and the resonant circuit voltage the differential voltage can selected such that the differential voltage becomes temperature-independent either at resonance of the resonant circuit or in a resonance amplitude of the resonant circuit voltage, respectively, or
   is temperature-independent for an amplitude of the resonant circuit voltage which is symmetrically located to the resonant frequency of the resonant circuit on the resonance slopes.

5. Inductive proximity switch according to claim 3, wherein
   the transconductance amplifier has a selectable slope.

6. Inductive proximity switch according to claim 1, wherein
   to a center point of voltage divider is applied one end of receiving coil and at whose other end is obtained the differential voltage.

7. Inductive proximity switch according to claim 6, wherein
   the series connection of the two complex resistors of the voltage divider is a series connection of two capacitors and the auxiliary voltage signal falls across one of the two capacitors.

8. Inductive proximity switch according to claim 7, wherein
   the capacitance of the resonant circuit is at least partially formed by the capacitors or one of the capacitors or the self-capacitance of transmitting coil.

9. Inductive proximity switch according to claim 1, wherein
   the auxiliary voltage signal is simultaneously applied to two signal inputs of an impedance converter, one end of the receiving coil being applied to the output of impedance converter and, with respect to ground or to a potential, the differential voltage is obtained at the output of receiving coil.

10. Inductive proximity switch according to claim 1, wherein
at least one of the two complex resistors of the complex voltage divider is adjustable, so that the resonant circuit voltage of the resonant circuit is divided in an adjustable ratio and consequently an adjustable differential voltage is obtained at the output of receiving coil.

11. Inductive proximity switch according to claim 1, wherein
the voltage divider is implemented with ohmic resistors.

12. Inductive proximity switch according to claim 1, wherein
the at least one transmitting coil and the at least one receiving coil form a planar coil system.

13. Inductive proximity switch according to claim 1, wherein
the at least one transmitting coil and the at least one receiving coil are in the form of circuit board coils.

14. Inductive proximity switch according to claim 1, wherein
the resonant circuit voltage is rectified and supplied to a threshold discriminator for obtaining the switching signal.

15. Inductive proximity switch according to claim 1, wherein
by means of the power source a supply current is impressed on the resonant circuit and the differential voltage is supplied to an amplifier, to whose output is connected one input of a multiplier and to whose other input is applied phase information of the supply current, influenced by means of a phase shifter, and the output of multiplier is supplied to the evaluating circuit for obtaining the switching signal.

16. Inductive proximity switch according to claim 1, wherein
the voltage obtained from the coil tap of transmitting coil is amplified in an amplifier and the auxiliary or differential voltage, respectively, is available downstream of the amplifier.

17. Method for operating an inductive proximity switch, with a resonant circuit comprising a resonant circuit transmitting coil and a capacitance, the resonant circuit transmitting coil generating an alternating magnetic field for inducing a mutual induction voltage in at least one receiving coil, and an oscillation state of the resonant circuit is influenced by a metallic release entering or moving away from the alternating magnetic field,
with an evaluating circuit for obtaining a switching signal from a change of the oscillation state of the resonant circuit, a change of the complex coupling between the at least two coils, namely transmitting coil and receiving coil, being evaluated as a switching signal with aid of an alternating auxiliary voltage signal in a presence or absence of the release,
wherein
the alternating auxiliary voltage signal is obtained as a partial voltage from an alternating resonant circuit voltage of the resonant circuit in a presettable ratio, a complex voltage divider resulting from a series connection of two complex resistors is connected in parallel to at least one of the transmitting coil and capacitance of the resonant circuit, and the alternating auxiliary voltage signal falls across one of the complex resistors,
the alternating auxiliary voltage signal being connected in series with the mutual induction voltage induced in the receiving coil to obtain a differential voltage with respect to ground or a potential at an output of the receiving coil, wherein a value of the differential voltage is reduced by the alternating auxiliary voltage signal compared with the induced mutual induction voltage, and
the switching signal being is generated from the differential voltage,
wherein
the auxiliary or differential voltage, respectively, is obtained by a correspondingly positioned tap through a tapping point on the transmitting coil, the tapping point subdividing the transmitting coil into the partial inductances.

18. Method according to claim 17, wherein
the differential voltage is supplied to the evaluating circuit for obtaining the switching signal.

19. Method according to claim 17, wherein
the differential voltage is supplied to a transconductance amplifier, whose current proportional to the differential voltage is fed back into the resonant circuit of the oscillator, and the resonant circuit voltage is supplied to the evaluating circuit for obtaining the switching signal.

20. Method according to claim 17, wherein
the resonant circuit voltage of the resonant circuit is divided in an adjustable ratio and as a result an adjustable differential voltage is obtained at the output of the receiving coil.

21. Method according to claim 17, wherein
by means of the presettable ratio between the auxiliary voltage signal and the resonant circuit voltage, the differential voltage is selected such that the differential voltage either becomes temperature-independent at resonance of the resonant circuit or in a resonance amplitude of the resonant circuit voltage, respectively, or becomes temperature-independent for an amplitude of the resonant circuit voltage which is located symmetrically to the resonant frequency of the resonant circuit on the resonance slopes.

* * * * *